(12) United States Patent
Broekaert et al.

(10) Patent No.: US 7,057,453 B1
(45) Date of Patent: Jun. 6, 2006

(54) METHOD AND SYSTEM FOR REDUCING PARASITIC FEEDBACK AND PARASITIC RESONANCES IN HIGH-GAIN TRANSIMPEDANCE AMPLIFIERS

(75) Inventors: Tom Peter Edward Broekaert, Thousand Oaks, CA (US); Marian Pospieszalski, Charlottesville, VA (US)

(73) Assignee: Inphi Corporation, Westlake Village, CA (US)

( * ) Notice: Subject to any disclaimer, the term of this patent is extended or adjusted under 35 U.S.C. 154(b) by 0 days.

(21) Appl. No.: 10/198,392

(22) Filed: Jul. 16, 2002

(51) Int. Cl.
*H03F 19/00* (2006.01)

(52) U.S. Cl. .................... 330/61 R; 330/309
(58) Field of Classification Search ............. 330/61 R, 330/65, 66, 67, 68, 292, 307 X, 294, 309; 297/3; 257/723, 528
See application file for complete search history.

(56) References Cited

U.S. PATENT DOCUMENTS

| | | | | |
|---|---|---|---|---|
| 4,028,639 A | * | 6/1977 | Hagon et al. ............ | 331/107 A |
| 4,782,381 A | * | 11/1988 | Ruby et al. ................. | 257/724 |
| 5,039,570 A | * | 8/1991 | Sturm ........................ | 428/209 |
| 5,225,796 A | * | 7/1993 | Williams et al. .............. | 333/12 |
| 5,631,807 A | * | 5/1997 | Griffin ........................ | 361/794 |
| 5,670,824 A | * | 9/1997 | Weinberg .................... | 257/723 |
| 6,472,942 B1 | * | 10/2002 | Lauffenburger et al. .... | 330/292 |
| 2003/0015707 A1 | * | 1/2003 | Bosco et al. .................. | 257/73 |

* cited by examiner

*Primary Examiner*—Linh My Nguyen
(74) *Attorney, Agent, or Firm*—Koppel, Patrick & Heybl

(57) ABSTRACT

Method and system for reducing parasitic feedback and resonances in high-gain transimpedance amplifiers. In a first embodiment of the present invention, a resistive layer is implemented in the gaps of a high-gain transimpedance amplifier's metallic planes. In a second embodiment of the present invention, a resistive layer is implemented underneath a high-gain transimpedance amplifier's ground plane, vias are implemented to create contact between the resistive layer and the ground plane.

24 Claims, 4 Drawing Sheets

METHOD AND SYSTEM FOR REDUCING PARASITIC FEEDBACK AND PARASITIC RESONANCES IN HIGH-GAIN TRANSIMPEDANCE AMPLIFIERS

BACKGROUND INFORMATION

1. Field of Invention

The present invention relates to transimpedance amplifiers, and more particularly, to high-gain transimpedance amplifiers with reduced parasitic feedback and resonances.

2. Description of Related Art

A transimpedance amplifier is used to convert an input current to a proportional output voltage. A typical transimpedance amplifier comprises: an input current that is supplied through a transistor input stage, the input current is typically produced by a photodiode; an output carrying an output voltage; and a coupling member connecting the input to the output. Furthermore, the input current may be small, such as 1 µA, or comparatively large, such as 1 mA.

Typical uses of transimpedance amplifiers include summing currents as part of a frequency impulse response filter or processing reverse current produced by a photodiode as function of infrared signal energy received by the photodiode.

FIG. 1A illustrates a layout diagram 100 of a conventional high-gain transimpedance amplifier. Layout diagram 100 comprises: a power plane denoted 1; a group of one or more capacitors such as the block illustrated in diagram 100 denoted as 3; a group of one or more transistors such as the circuitry illustrated in diagram 100 denoted as 4; and a group of one or more pads such as the block illustrated in diagram 100 denoted as 5, wherein the group of one or more pads connecting power plane 1 to components adjacent to the amplifier.

However, conventional transimpedance amplifiers are composed almost entirely of metallic structures comprising material such as gold, aluminum, or copper. Therefore, use of resistive materials is restricted to resistors only. Such metallic geometries in layout and packaging may form parasitic feedback paths and resonances that may turn a high-gain transimpedance amplifier into an oscillator.

According, there is a need to include resistive layers in transimpedance amplifiers in order to reduce parasitic feedback and resonances.

SUMMARY OF THE INVENTION

The present invention provides a method and system for reducing parasitic feedback and resonances in high-gain transimpedance amplifiers.

In a first embodiment of the present invention, a layer of resistive (e.g. Tantalum-Nitride, Nickel-Chrome, etc.) material is added in the gaps of a high-gain transimpedance amplifier's metal ground plane in order to reduce parasitic feedback and resonances.

In a second embodiment of the present invention, a layer of resistive (e.g. Tantalum-Nitride, Nickel-Chrome, etc.) material is added below a high-gain transimpedance amplifier's metal ground plane, along with vias for contacting the resistive layer to the metal ground plane.

BRIEF DESCRIPTION OF THE DRAWINGS

The accompanying drawings that are incorporated in and form a part of this specification illustrate embodiments of the invention and together with the description, serve to explain the principles of the invention.

DETAILED DESCRIPTION

The following description is presented to enable one of ordinary skill in the art to make and use the invention and is provided in the context of a patent application and its requirements. In the following description, specific nomenclature is set forth to provide a thorough understanding of the present invention. It will be apparent to one skilled in the art that the specific details may not be necessary to practice the present invention. Furthermore, various modifications to the embodiments will be readily apparent to those skilled in the art and the generic principles herein may be applied to other embodiments. Thus, the present invention is not intended to be limited to the embodiments shown but is to be accorded the widest scope consistent with the principles and features described herein.

Figure 1A:
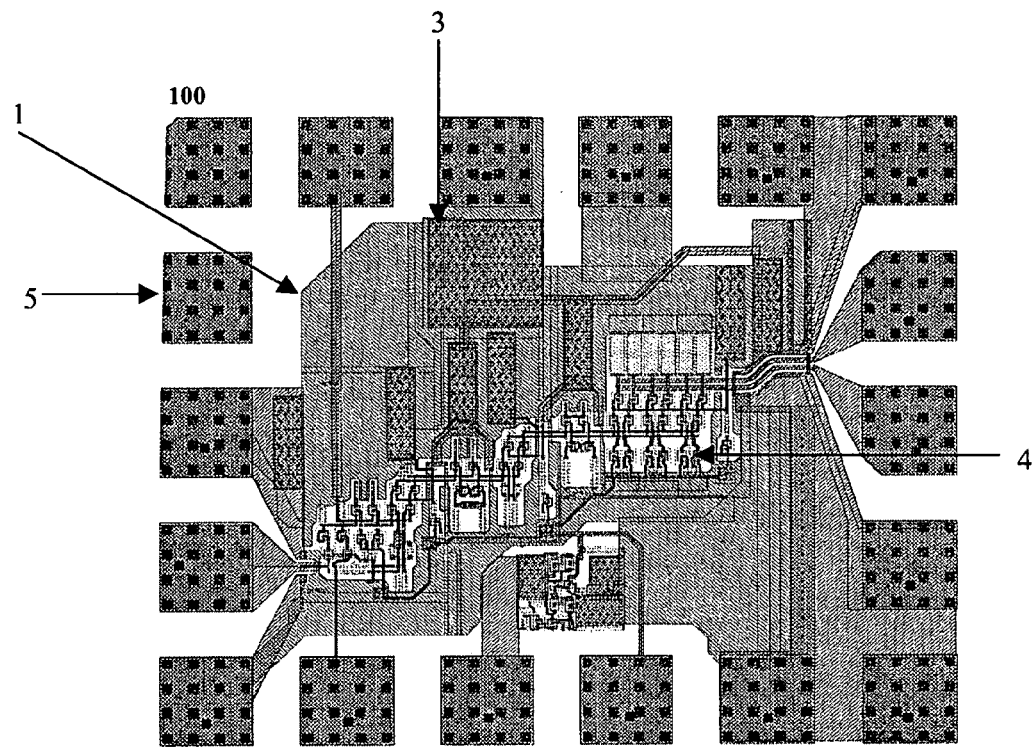
FIG. 1A is a layout diagram illustrating a conventional transimpedance amplifier.
Figure 1B:
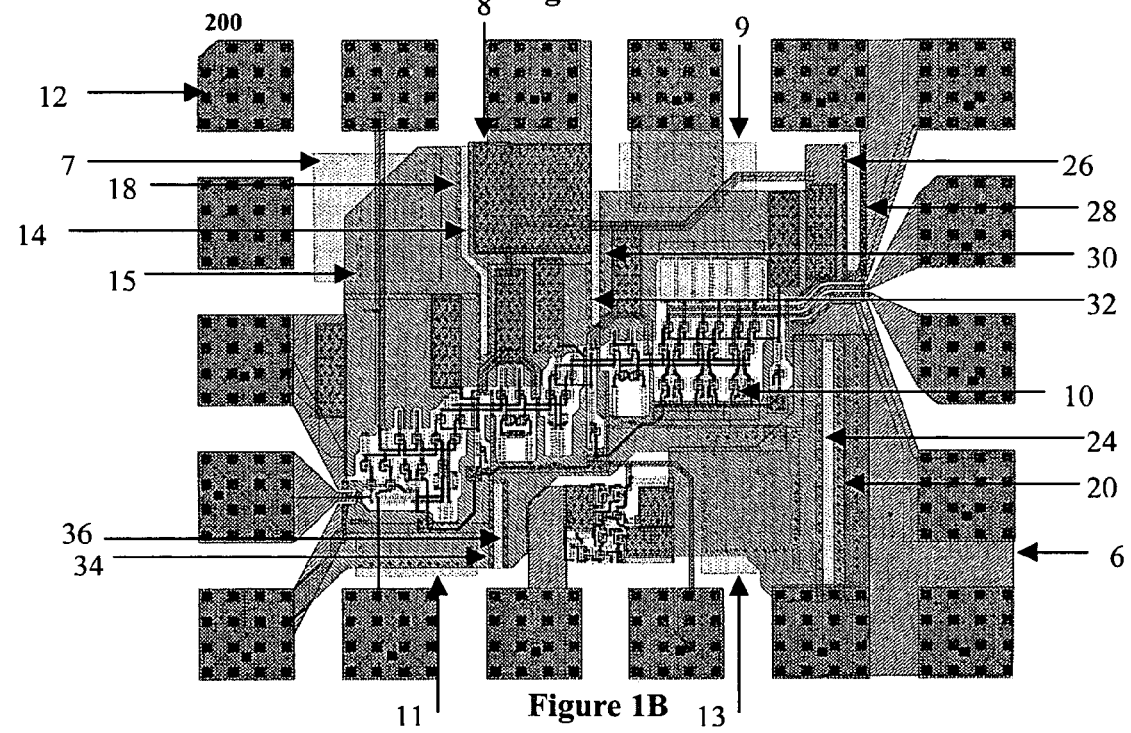
FIG. 1B is a layout diagram illustrating a transimpedance amplifier according to one embodiment of the present invention.

FIG. 1B illustrates a schematic diagram 200 of a high-gain transimpedance amplifier in accordance to one embodiment of the present invention. Schematic diagram 200 comprises: a ground plane denoted 6; a group of one or more capacitors such as the block illustrated in diagram 200 denoted as 8; a group of one or more transistors such as the circuitry illustrated in diagram 200 denoted as 10; a group of one or more pads such as the block illustrated in diagram 200 denoted as 12, wherein the group of one or more pads connecting ground plane 6 to components adjacent to the amplifier; a layer comprising resistive (e.g. Tantalum-Nitride, Nickel-Chrome, etc.) material such as the blocks illustrated in diagram 200 denoted as 7, 9, 11, 13, 14, 18, 20, 24, 26, 28, 30, 32, 34 and 36; and a group of one or more vias on each resistive pads such as the via illustrated in diagram 200 denoted 15.

The resistive layer illustrated in the transimpedance amplifier of FIG. 11B allows the amplifier to possibly reduce parasitic feedback and dampen parasitic resonances. Moreover, the resistive layer is constructed in the ground plane of the amplifier and does not alter the design of the amplifier elsewhere.

Furthermore, the resistive layer is typically added with a direct current (DC) contact to the ground plane. The group of one or more vias illustrated in diagram 200 provide such a contact between the resistive layer and the ground plane.

Figure 2:
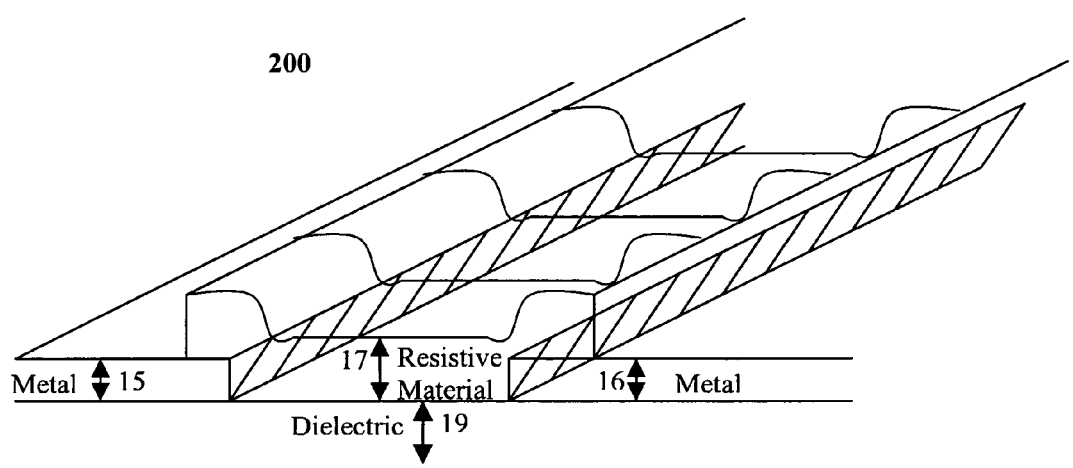
FIG. 2 is a diagram illustrating a sectional view of a transimpedance amplifier in accordance to one embodiment of the present invention, wherein a layer of resistive material is implemented in a gap on the metal ground plane of the amplifier.

FIG. 2 illustrates a sectional view of a high-gain transimpedance amplifier 200 in accordance to one embodiment of the present invention. Transimpedance amplifier 200 comprises: a ground plane comprising a first layer of metallic (e.g. gold, aluminum, copper, etc.) material denoted 15 and a second layer of metallic (e.g. gold, aluminum, copper, etc.) material denoted 16; a layer of resistive (e.g. Tantalum-Nitride, Nickel-Chrome, etc.) material denoted 17; and a layer of dielectric denoted 19.

As shown in FIG. 2, the layer of metallic material 15 lies adjacent to the layer of metallic material 16, the two layers lie parallel on the same plane, and an electric disconnect or gap lies between the layer of metallic material 15 and the layer of metallic material 16. Moreover, the layer of resistive material 17 lies in the brake between the first metallic material 15 and the second metallic material 16.

Furthermore, as shown in FIG. 2, the layer of resistive materials in FIG. 2 makes direct contact with the ground plane in order to reduce parasitic feedback and dampen parasitic resonances.

Figure 3:
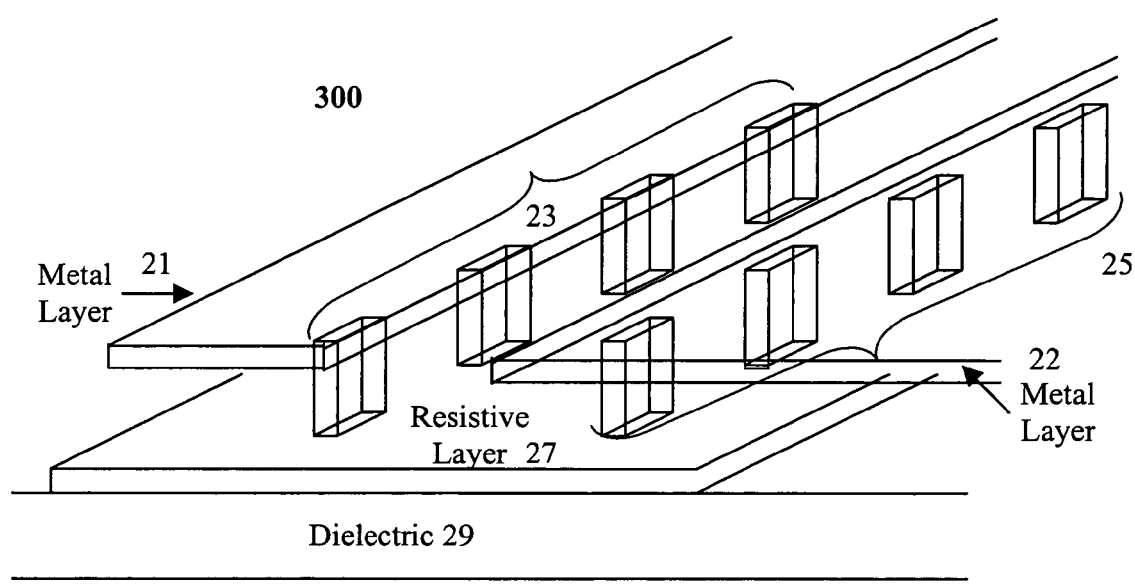
FIG. 3 is a diagram illustrating a section view for a transimpedance amplifier in accordance to one embodiment of the present invention, wherein a layer of resistive material is implemented below the metal ground plane of the amplifier.

FIG. 3 illustrates a sectional view of a high-gain transimpedance amplifier 300 in accordance to a second embodiment of the present invention. Transimpedance amplifier 300 comprises: a ground plane comprising a first layer of metallic (e.g. gold, aluminum, copper, etc.) material denoted 21 and a second layer of metallic (e.g. gold, aluminum, copper, etc.) material denoted 22; a first group of one or more vias denoted 23; a second group of vias denoted 25; a layer of resistive (e.g. Tantalum-Nitride, Nickel-Chrome, etc.) material denoted 27; and a layer of dielectric denoted 29.

As shown in FIG. 3, the layer of resistive material 27 lies directly atop the layer of dielectric 29. The first group of one or more vias 23 and the second of one or more vias 25 are implemented on top of the layer of resistive material 27. Moreover, the first layer of metallic material 21 lies directly atop the first group of one or more vias 23, and the second layer of metallic materials 23 lies directly atop the second group of one or more vias 25.

Furthermore, as shown in FIG. 3, the layer of resistive material makes contact with the ground plane via the first and the second groups of one or more vias, and the layer of resistive material reduces parasitic feedback and dampens parasitic resonances.

Figure 4A:
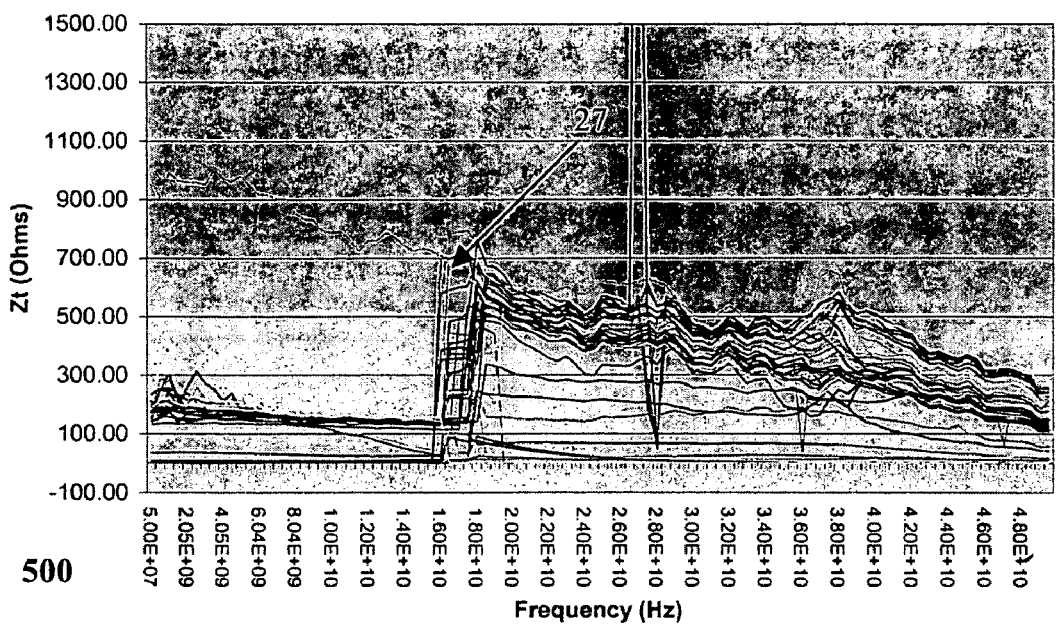
FIG. 4A is a graph illustrating the frequency response of an oscillating transimpedance amplifier without reduced parasitic feedback and resonances.

FIG. 4A illustrates a transimpedance gain vs. frequency graph 500 for a conventional transimpedance amplifier without a layer comprising resistive material. The step denoted 27 in FIG. 4A illustrates a condition caused by an oscillation owing to parasitic feedback and resonance.

Figure 4B:
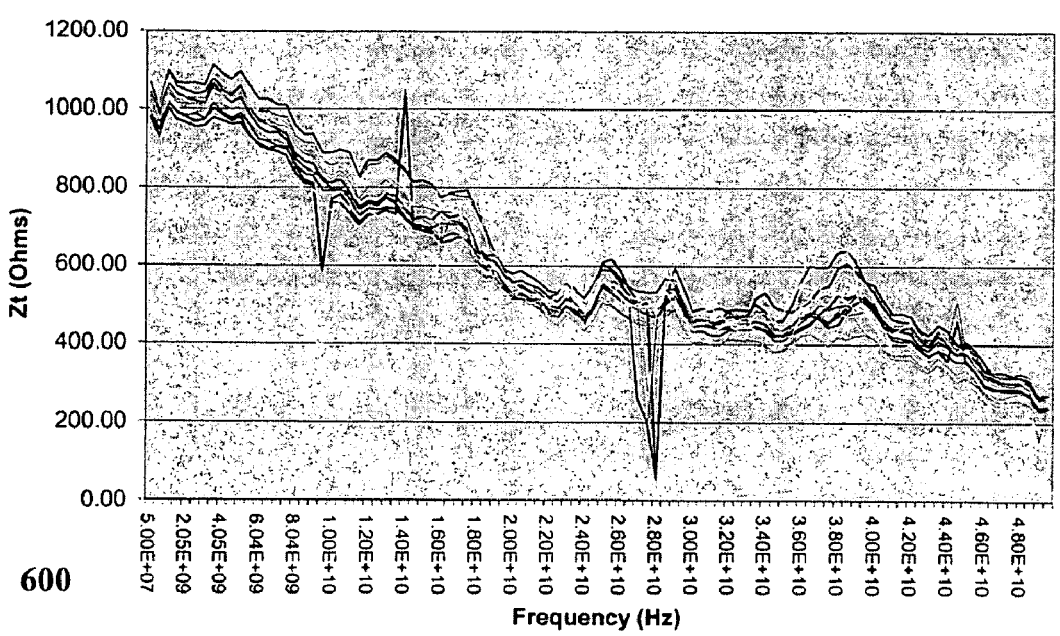
FIG. 4B is a graph illustrating the frequency response of a transimpedance amplifier in accordance to one embodiment of the present invention.

FIG. 4B illustrates transimpedance gain vs. frequency graph 600 for a transimpedance amplifier in accordance to one embodiment of the present invention. A layer of resistive (e.g. Tantalum-Nitride, Nickel-Chrome, etc.) material is built into the amplifier that reduces parasitic feedback and resonances, thereby eliminating the oscillation condition illustrated in FIG. 4A.

Although the invention has been described in connection with several embodiments, it is understood that this invention is not limited to the embodiments disclosed, but is capable of various modifications that would be apparent to a person skilled in the art.

For example, although the resistive layer is described as typically added with a DC contact to the ground plane, a floating (i.e. no DC contact) resistive layer may be added as well.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the arts to best utilize the invention and various embodiments with various modifications as are suited to the particular use contemplated. It is intended that the scope of the invention be defined by the claims appended hereto and their equivalents.

We claim:

1. A high-gain transimpedance amplifier, comprising:
a metallic ground plane; and
a layer of resistive material implemented below the metallic ground plane;
wherein there is no direct electrical contact between the metallic ground plane and the layer of resistive material;
such that said resistive material absorbs RF energy that might otherwise result in parasitic feedback between said amplifier's output and input.

2. The amplifier of claim 1, further comprising a layer of dielectric implemented below the layer of resistive material.

3. The amplifier of claim 1, wherein the metallic ground plane comprises gold.

4. The amplifier of claim 1, wherein the metallic ground plane comprises aluminum.

5. The amplifier of claim 1, wherein the metallic ground plane comprises copper.

6. The amplifier of claim 1, wherein the resistive material comprises Tantalum-Nitride.

7. The amplifier of claim 1, wherein the resistive material comprises Nickel-Chrome.

8. A high-gain transimpedance amplifier, comprising:
a ground plane comprising a first layer of metallic material and a second layer of metallic material, wherein the first layer of metallic material lies adjacent to the second layer of metallic material; and
a layer of resistive material implemented below the ground plane;
wherein there is no direct electrical contact between the first layer of metallic material and the layer of resistive material, wherein there is no direct electrical contact between the second layer of metallic material and the layer of resistive material;
such that said resistive material absorbs RF energy that might otherwise result in parasitic feedback between said amplifier's output and input.

9. The amplifier of claim 8, wherein the first layer of metallic material and the second layer of metallic material lie parallel on the same plane.

10. A high-gain transimpedance amplifier, comprising:
a ground plane comprising a first layer of metallic material and a second layer of metallic material, wherein the first layer of metallic material lies adjacent to the second layer of metallic material; and
a layer of resistive material implemented below the ground plane;
wherein there is no direct contact between the first layer of metallic material and the layer of resistive material, wherein there is no direct contact between the second layer of metallic material and the layer of resistive material; and
wherein a gap or electrical disconnect lies between the first layer of metallic material and the second layer of metallic material.

11. The amplifier of claim 8, further comprising a layer of dielectric implemented below the layer of resistive material.

12. A high-gain transimpedance amplifier, comprising:
a ground plane comprising a first layer of metallic material and a second layer of metallic material, wherein the first layer of metallic material lies adjacent to the second layer of metallic material with a gap or electrical disconnect between the first layer of metallic material and the second layer of metallic material; and
a layer of resistive material implemented in the gap between the first layer of metallic material and the second layer of metallic material;
wherein there is no direct contact between the first layer of metallic material and the layer of resistive material, wherein there is no direct contact between the second layer of metallic material and the layer of resistive material.

13. The amplifier of claim 12, wherein the first layer of metallic material and the second layer of metallic material lie parallel on the same plane.

14. The amplifier of claim 12, further comprising a layer of dielectric implemented below the layer of resistive material and the ground plane.

15. A high-gain transimpedance amplifier, comprising:
a ground plane comprising a first layer of metallic material and a second layer of metallic material, wherein the first layer of metallic material lies adjacent to the second layer of metallic material with a gap or electrical disconnect between the first layer of metallic material and the second layer of metallic material; and
a layer of resistive material implemented in the gap between the first layer of metallic material and the second layer of metallic material;
wherein a single or a plurality of vias are implemented between the ground plane and the layer of resistive material to provide contact between the ground plane and the layer of resistive material wherein amount of the vias is not two.

16. A high-gain transimpedance amplifier, comprising:
a ground plane comprising a first layer of metallic material, a second layer of metallic material, a third layer of metallic material, and a fourth layer of metallic material, wherein the first layer of metallic material lies adjacent to the second layer of metallic material and the third layer of metallic material lies adjacent to the fourth layer of metallic material; and
a layer of resistive material implemented below the ground plane;
wherein there is no direct electrical contact between the metallic ground plane layers and the layer of resistive material;
such that said resistive material absorbs RF energy that might otherwise result in parasitic feedback between said amplifier's output and input.

17. The amplifier of claim 16, wherein the first layer of metallic material, the second layer of metallic material, the third layer of metallic material, and the fourth layer of metallic material all lie parallel on the same plane.

18. A high-gain transimpedance amplifier, comprising:
a ground plane comprising a first layer of metallic material, a second layer of metallic material, a third layer of metallic material, and a fourth layer of metallic material, wherein the first layer of metallic material lies adjacent to the second layer of metallic material and the third layer of metallic material lies adjacent to the fourth layer of metallic material; and
a layer of resistive material implemented below the ground plane;
wherein a gap or electrical disconnect lies between the first layer of metallic material and the second layer of metallic material.

19. A high-gain transimpedance amplifier, comprising:
a ground plane comprising a first layer of metallic material, a second layer of metallic material, a third layer of metallic material, and a fourth layer of metallic material, wherein the first layer of metallic material lies adjacent to the second layer of metallic material and the third layer of metallic material lies adjacent to the fourth layer of metallic material; and
a layer of resistive material implemented below the ground plane;
wherein a gap or electrical disconnect lies between the third layer of metallic material and the fourth layer of metallic material.

20. The amplifier of claim 16, further comprising a layer of dielectric implemented below the layer of resistive material.

21. A high-gain transimpedance amplifier, comprising:
a ground plane comprising a first layer of metallic material, a second layer of metallic material, a third layer of metallic material, and a fourth layer of metallic material, wherein the first layer of metallic material lies adjacent to the second layer of metallic material with a first gap or electrical disconnect between the first layer of metallic material and the second layer of metallic material, and the third layer of metallic material lies adjacent to the fourth layer of metallic material with a second gap or electrical disconnect between the third layer of metallic material and the fourth layer of metallic material; and
a layer of resistive material implemented in the gap between the first layer of metallic material and the second layer of metallic material and in the gap between the third layer of metallic material and the fourth layer of metallic material.

22. The amplifier of claim 21, wherein the first layer of metallic material, the second layer of metallic material, the third layer of metallic material, and the fourth layer of metallic material all lie parallel on the same plane.

23. The amplifier of claim 21, further comprising a layer of dielectric implemented below both the layer of resistive material and the ground plane.

24. The amplifier of claim 21, wherein the layer of resistive material is in direct contact with the ground plane.

* * * * *